(12) United States Patent
Clevenger et al.

(10) Patent No.: US 7,115,921 B2
(45) Date of Patent: Oct. 3, 2006

(54) NANO-SCALED GATE STRUCTURE WITH SELF-INTERCONNECT CAPABILITIES

(75) Inventors: Lawrence A. Clevenger, LaGrangeville, NY (US); Timothy Joseph Dalton, Ridgefield, CT (US); Louis L. Hsu, Fishkill, NY (US); Carl Radens, LaGrangeville, NY (US); Keith Kwong Hon Wong, Wappingers Falls, NY (US); Chih-Chao Yang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 10/930,989

(22) Filed: Aug. 31, 2004

(65) Prior Publication Data

US 2006/0043435 A1    Mar. 2, 2006

(51) Int. Cl.
  *H01L 29/80* (2006.01)
  *H01L 29/76* (2006.01)
  *H01L 21/337* (2006.01)
  *H01L 21/336* (2006.01)

(52) U.S. Cl. .............. 257/270; 257/331; 257/341; 257/365; 257/366; 257/367; 438/193; 438/195; 438/284

(58) Field of Classification Search ........... 257/270, 257/331, 341, 365, 366, 367; 438/193, 195, 438/284
See application file for complete search history.

(56) References Cited

U.S. PATENT DOCUMENTS

| | | | |
|---|---|---|---|
| 4,618,510 A * | 10/1986 | Tan | 438/571 |
| 4,975,382 A | 12/1990 | Takasugi | |
| 5,185,277 A * | 2/1993 | Tung et al. | 438/579 |
| 5,300,445 A * | 4/1994 | Oku | 438/571 |
| 5,387,529 A * | 2/1995 | Oku | 438/523 |
| 5,399,896 A * | 3/1995 | Oku | 257/412 |
| 5,538,910 A * | 7/1996 | Oku | 438/172 |
| 6,159,781 A | 12/2000 | Pan et al. | |
| 6,653,181 B1* | 11/2003 | Hergenrother et al. | 438/206 |
| 2003/0119233 A1* | 6/2003 | Koganei | 438/182 |

OTHER PUBLICATIONS

B. Doris et al., "Extreme Scaling with Ultra-Thin Si Channel MOSFETs," IEEE, 4 pages, 2002.
"New Roadmap Identifies Industry Challenges," Semiconductor International, 6 pages, 2004.
R. Li et al., "Damascene W/TiN Gate MOSFETs with Improved Performance for 0.1-μm Regime," IEEE Transactions on Electron Devices, vol. 49, No. 11, pp. 1891-1896, Nov. 2002.
B.J. Ginsberg et al., "Selective Epitaxial Growth of Silicon and Some Potential Applications," IBM J. Res. Develop., vol. 34, No. 6, Nov. 1990.

* cited by examiner

*Primary Examiner*—Long Pham
*Assistant Examiner*—Shrinivas H. Rao
(74) *Attorney, Agent, or Firm*—Robert M. Trepp; Ryan, Mason & Lewis, LLP

(57) ABSTRACT

Gate conductors on an integrated circuit are formed with enlarged upper portions which are utilized to electrically connect the gate conductors with other devices. A semiconductor device comprises a gate conductor with an enlarged upper portion which electrically connects the gate conductor to a local diffusion region. Another semiconductor device comprises two gate conductors with enlarged upper portions which merge to create electrically interconnected gate conductors. Methods for forming the above semiconductor devices are also described and claimed.

19 Claims, 5 Drawing Sheets

US 7,115,921 B2

NANO-SCALED GATE STRUCTURE WITH SELF-INTERCONNECT CAPABILITIES

FIELD OF THE INVENTION

The present invention relates generally to integrated circuits, and more particularly relates to techniques for forming gate conductors in integrated circuits.

BACKGROUND OF THE INVENTION

When designing integrated circuits, the circuit designer must continually consider both efficient space utilization and process capabilities. Such considerations are particularly important when designing around gate conductors. Failure to create area-efficient designs will result in designs that do not meet size specifications. Perhaps worse, failure to create designs within the process capabilities of the fabrication technology will result in ongoing yield issues that may only be capable of being corrected by expensive and time-consuming redesigns.

Modern integrated circuits frequently contain devices wherein gate conductors are electrically connected to diffusion regions formed in a substrate. For instance, it is often desirable in metal-oxide-semiconductor (MOS) capacitors and diodes to connect a gate conductor to a source or drain region of the same or an adjacent MOS device. In order to form such devices, the designer will typically contact the gate conductor through one or more vertical contacts and then tie the gate conductor to the desired diffusion region by use of one or more metal interconnects. FIG. 1 shows an illustrative layout of such a conventional device. Gate conductor 100 is formed at least partially between source and drain diffusion regions 110, 120. Metal interconnect 130 is electrically connected to gate conductor 100 via a vertical contact 140. Metal interconnect 130 is, in turn, electrically connected to the diffusion region 120 by a plurality of vertical contacts 150.

Contacting discrete, unenlarged gate conductors with vertical contacts becomes increasingly more difficult as integrated circuits are reduced in size. Typically, a design that uses such features pushes the limits of process capabilities such as gate conductor dimension control, vertical contact dimension control, and lithographic overlay control. Inadequate control may result in vertical contacts that partially or fully miss landing on a corresponding gate conductor. A possible solution to this process problem, designing gate conductors with pads to act as enlarged landing regions for vertical contacts, utilizes significant additional area in the integrated circuit and is, thus, undesirable.

Moreover, in certain applications, it is beneficial to connect the gate conductor of one device to the gate conduction of one or more other devices. These designs may interconnect the gate conductors in parallel or in series. For example, a common device connects two or more gate conductors in series and uses the interconnected gate conductors to modulate current between shared source and drain regions. Such a device is typically used to reduce hot carrier degradation by reducing the voltage drop between source and drain across any one transistor.

FIG. 2 shows a typical MOS device employing an interconnected gate arrangement. Gate conductors 200 and 210 are formed with source region 230 and drain region 240. A shared diffusion region 250 is formed between the gate conductors 200, 210 of the same conductivity type as the source and drain regions. Gate-level interconnect feature 220 serves to electrically connect gate conductors 200, 210 to each other. Unfortunately, such a design may not be efficient in terms of space utilization. A gate-level interconnect feature, like that shown in FIG. 2, is typically formed outside the active diffusion regions of the device. As a result, its use requires that the gate conductors be extended into this non-active region. Consequently, such a design for interconnecting gate conductors may consume large areas on the integrated circuit and is, thus, undesirable.

There is a need, therefore, for a design and/or method whereby a gate conductor can be electrically connected to a local diffusion region without the need for vertical contacts on the gate structure. In addition, there is also a need for a design and/or method in which a gate conductor can be electrically connected to another gate conductor without the use of gate-level interconnect features like that shown in FIG. 2.

SUMMARY OF THE INVENTION

The present invention addresses the above-identified needs by providing, in an illustrative embodiment, improved techniques for electrically connecting a gate conductor to a diffusion region and/or connecting a gate conductor to one or more other gate conductors. The invention relies on gate conductors formed with enlarged upper portions to provide the desired interconnection.

In accordance with one aspect of the invention, a semiconductor device comprises a substrate of a first conductivity type, a source region of a second conductivity type formed in the substrate proximate an upper surface of the substrate, and a drain region of the second conductivity type formed in the substrate proximate the upper surface of the substrate and spaced apart from the source region. The device further comprises a gate dielectric layer formed on at least a portion of the upper surface of the substrate, and a raised source feature and a raised drain feature formed on the upper surface of the substrate such that the raised source and drain features are electrically connected to the source and drain regions, respectively. A gate structure is formed on the gate dielectric layer and at least partially between the source and drain regions. This gate structure includes a lower gate portion formed on the gate dielectric layer and an enlarged upper gate portion supported above the gate dielectric layer by the lower gate portion. The upper gate portion is wider than the lower gate portion. Moreover, at least a portion of the upper gate portion merges with at least one of the raised source and drain regions causing the gate structure to be electrically connected to at least one of the source and drain regions, respectively.

In accordance with another aspect of the invention, a semiconductor device comprises a substrate of a first conductivity type, and a first and second transistor structure. Each transistor structure includes a gate dielectric layer formed on the upper surface of the substrate, a lower gate portion formed on the gate dielectric layer, and an enlarged upper gate portion supported above the gate dielectric layer by the lower gate portion. The upper gate portion is wider than the lower gate portion. Moreover, at least a portion of the upper gate portion of the first transistor structure merges with at least a portion of the upper gate portion of the second transistor structure causing the first transistor structure to be electrically connected to the second transistor structure.

In accordance with a third aspect of the invention, a method for forming a semiconductor device comprises forming a substrate of a first conductivity type, forming a source region of a second conductivity type in the substrate proximate an upper surface of the substrate, and forming a drain region of the second conductivity type in the substrate proximate the upper surface of the substrate and spaced apart from the source region. In addition, the method further comprises forming a gate dielectric layer on at least a portion of the upper surface of the substrate, and forming a raised source feature and a raised drain feature on the upper surface of the substrate such that the raised source and drain features are electrically connected to the source and drain regions, respectively. The method of forming the semiconductor device further comprises forming a gate structure on the gate dielectric layer at least partially between the source and drain regions. This gate structure includes a lower gate portion formed on the gate dielectric layer and an enlarged upper gate portion supported above the gate dielectric layer by the lower gate portion. The upper gate portion is wider than the lower gate portion. Moreover, at least a portion of the upper gate portion merges with at least one of the raised source and drain features causing the gate structure to be electrically connected to at least one of the source and drain regions, respectively.

In accordance with yet another aspect of the invention, a method for forming a semiconductor device comprises forming a substrate of a first conductivity type, and forming a first and second transistor structure. Each transistor structure comprises a gate dielectric layer formed on an upper surface of the substrate, a lower gate portion formed on the gate dielectric layer, and an enlarged upper gate portion supported above the gate dielectric layer by the lower gate portion. The upper gate portion is wider than the lower gate portion. Moreover, at least a portion of the upper gate portion of the first transistor structure merges with at least a portion of the upper gate portion of the second transistor structure causing the first transistor structure to be electrically connected to the second transistor structure.

DETAILED DESCRIPTION OF THE INVENTION

The invention will be illustrated herein in conjunction with exemplary designs and methods for electrically connecting gate conductors to diffusion regions and/or for connecting gate conductors to one or more other gate conductors utilizing enlarged gate features. It should be understood, however, that the invention is not limited to the particular structural and/or circuitry arrangements shown and described herein. Modifications to the illustrative embodiments will become apparent to those skilled in the art in view of the techniques of the present invention.

It should also be understood that the various layers and/or regions shown in the accompanying figures may not be drawn to scale, and that one or more semiconductor layers and/or regions of a type commonly used in such integrated circuits may not be explicitly shown in a given figure for ease of explanation. This does not imply that the semiconductor layer(s) and/or region(s) not explicitly shown are omitted from the actual integrated circuit structure.

Figure 1:
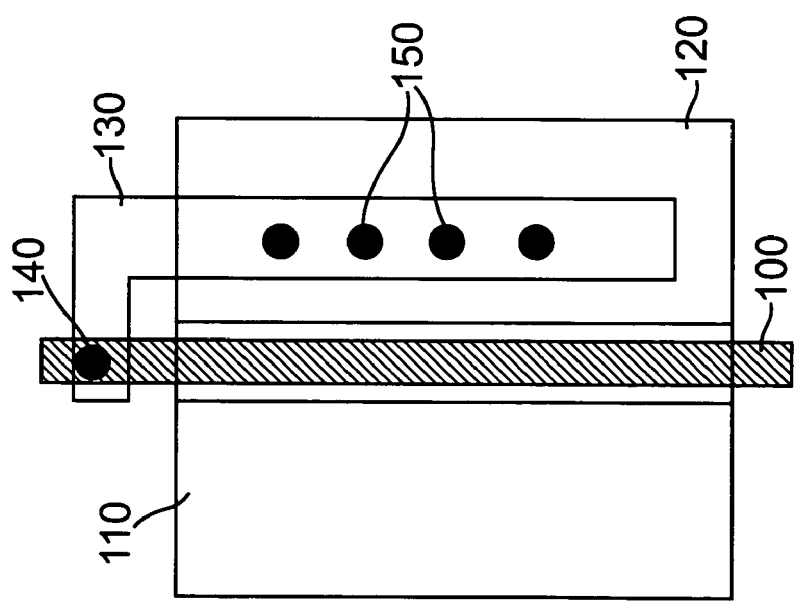
FIG. 1 is a top plan view of a semiconductor device illustrating a conventional methodology for connecting a gate conductor to a local diffusion region.
Figure 3C:
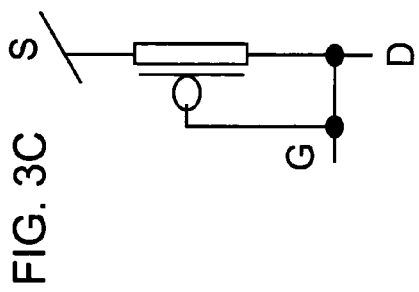
FIG. 3C is a schematic diagram depicting the exemplary device shown in FIGS. 3A and 3B.
Figure 3A:
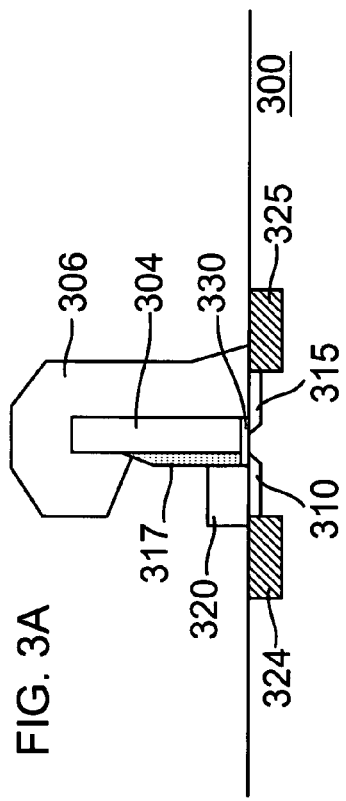
FIG. 3A is a cross-sectional view of an exemplary drain-shorted device formed in accordance with an illustrative embodiment of the invention.

As described above with reference to FIG. 1, a gate conductor in a conventional MOS device is frequently connected to a local diffusion region by the use of local metal interconnects. Such a device, which may be referred to herein as a "drain-shorted gate device," requires the formation of vertical contacts on narrow gate conductors, thereby creating a certain limitation as to the minimum length of the gate conductors. The present invention overcomes these and other problems by providing, in illustrative embodiments, novel techniques for electrically connecting a gate conductor of a given device to a drain or source region in a same or different device. FIG. 3A shows a cross-sectional view of a portion of an exemplary integrated circuit formed in accordance with one embodiment of the invention. A corresponding top plan view and schematic diagram are shown in FIGS. 3B and 3C, respectively.

In the portion of the exemplary device shown in FIG. 3A, the drain-shorted gate device comprises a single gate conductor formed of a lower gate portion 304 and an enlarged upper gate portion 306. The lower gate portion 304 is formed on a gate dielectric layer 330. A source region 310 and a drain region 315 are formed in a substrate 300. On one side of the device, the enlarged upper gate portion 306 contacts the drain region 315 so as to electrically connect the gate conductor with the drain region. On an opposite side of the device, a spacer 317 electrically isolates the gate conductor from a raised source region 320, which may be formed on top of, and in electrical contact with, the source region 310. Shallow trench features 324 and 325 are preferably filled with an insulating material, such as, for example, silicon dioxide, and act to isolate the device from other nearby devices (not shown).

Figure 3B:
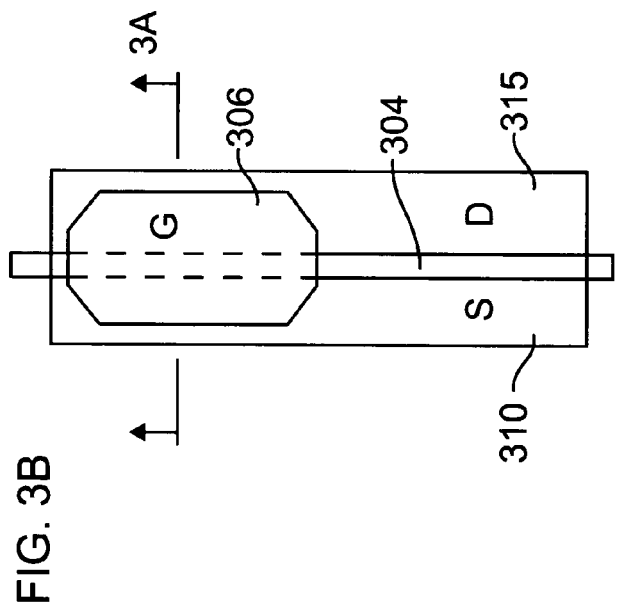
FIG. 3B is a top plan view of the exemplary device shown in FIG. 3A.

FIG. 3B shows certain voltage/signal designations applied to the various corresponding regions of the device, such as, for instance, gate (G) applied to the upper gate portion 306, source (S) applied to the source region 310, and drain (D) applied to the drain region 315. From this view, it also becomes evident that the enlarged upper gate portion 306 need not be formed along the entire length of the lower gate portion 304, but may be formed in one or more regions along the length of lower gate portion 304, as desired. FIG. 3C indicates that the illustrative embodiment shown in FIGS. 3A and 3B forms a MOS transistor in which the gate conductor (G) is electrically connected to the drain (D).

FIGS. 4A–4F are cross-sectional views depicting exemplary process steps for forming the device shown in FIGS.

3A–3B. The process steps described in reference to these figures are not intended to encompass all of the processing steps which may be required to successfully form the device. For ease of explanation, certain processing steps which are conventionally used in forming an integrated circuit device, such as, for example, wet cleaning and annealing, will not be described herein. However, one skilled in the art will readily recognize those processing steps omitted from this generalized description. Moreover, details of the process steps used to fabricate such a semiconductor device may be found in a number of publications, for example, S. Wolf and R. N. Tauber, *Silicon Processing for the VLSI Era, Volume 1—Process Technology*, Lattice Press, 1986, and S. M. Sze, *VLSI Technology, Second Edition*, McGraw-Hill, 1988, which are incorporated herein by reference. It should be noted that the processing steps described in conjunction with FIGS. 4A–4F are illustrative, and that the present invention is not limited to the particular methodology shown.

Figure 4A:
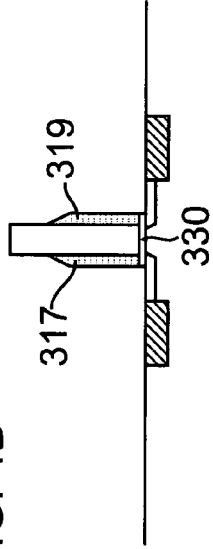
FIGS. 4A–4F are cross-sectional views depicting exemplary process steps for forming the device shown in FIG. 3A, in accordance with the present invention.

With reference to FIG. 4A, a gate dielectric layer 330 has been grown on the substrate 300 using commonly known processing techniques (e.g., oxidation). The lower gate portion 304 of the gate structure has also been formed. The lower gate portion 304 is formed, for example, by first depositing a gate material on the gate dielectric layer 330 and then depositing a hard mask layer 335 on top of the gate material. A photoresist layer is then applied on top of the hard mask layer 335 and the photoresist layer is patterned and developed using commonly known photolithography techniques. The hard mask layer is then etched away in those regions exposed by the developed photoresist using, for example, reactive ion etching. After stripping the photoresist, the remainder of the gate material is etched using a second reactive ion etching step which does not etch the hard mask layer 335 or the gate dielectric 330. Those regions of the gate material without the hard mask layer will be removed leaving a lower gate portion with a hard mask layer on top.

The gate material preferably comprises doped polysilicon, but may alternatively comprise other materials that are suitable for forming gate conductors (e.g., tungsten). Forming the lower gate portion 304 is preferably carried out by standard chemical vapor deposition techniques that will be known to those skilled in the art. The hard mask layer 335 preferably comprises silicon dioxide, but may alternatively comprise any other material suitable for such purpose. The hard mask layer may also be deposited by chemical vapor deposition.

Figure 4B:
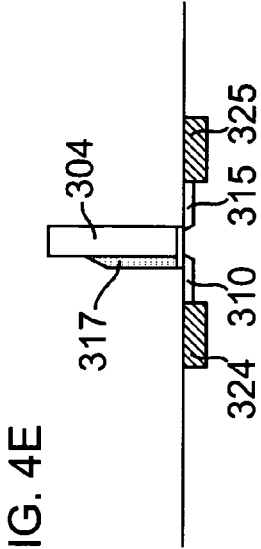
Figure 4C:
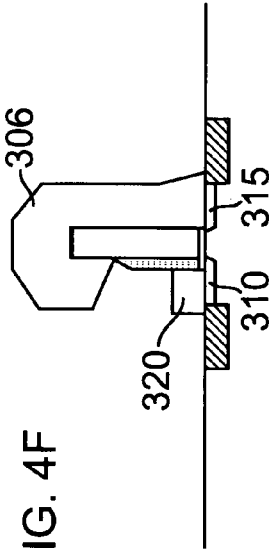

As depicted in FIG. 4B, the source and drain regions 310 and 315, respectively, are formed in the substrate 300. Photolithography and ion implantation are preferably used in this processing step. Subsequently, a spacer material is conformally deposited on the exposed surfaces of the structure, preferentially by chemical vapor deposition, and etched, for example, by reactive ion etching which does not etch the hard mask layer 335 and the gate dielectric 330. The result, after the photoresist is stripped, is shown in FIG. 4C. The directional nature of the reactive ion etching leaves spacers 317, 319 formed on at least portions of the sidewalls of the lower gate portion 304, but substantially removes any spacer material on horizontal surfaces of the structure. The spacers 317, 319 will preferably comprise silicon nitride, but may also comprise other suitable insulating materials, including, but not limited to, silicon oxynitride and silicon dioxide.

Figure 4D:
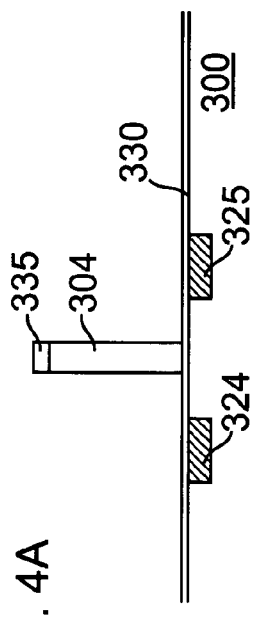

Next, photolithography is used to cover those regions of the integrated circuit where drain-shorted gate devices are not intended. Those gate regions where the drain-shorted gate devices are desired are left exposed after developing the photoresist. With the photoresist in place, the structure is exposed to an etching process (e.g., reactive ion etching) to remove the hard mask layer 335 and exposed gate dielectric 330, and to recess the exposed spacers 317, 319 further down the sidewalls of the lower gate portion 304. The photoresist is then stripped from the remainder of the integrated circuit. Those gate regions exposed to the reactive ion etching now appear as shown in FIG. 4D. Gate regions that were covered by hard mask layer 335 during the etching step will remain as shown in FIG. 4C.

With reference to FIG. 4D, another photolithographic mask is used to protect one side of the lower gate portion 304 while leaving the other side of the lower gate portion exposed. In other words, spacer 317 is preferably covered by photoresist while spacer 319 is exposed to further processing. Reactive ion etching is then used to remove spacer 319 while leaving spacer 317 intact, thereby creating the structure shown in FIG. 4E. As before, those gate regions entirely covered by photoresist will continue to look like the structure shown in FIG. 4C. The photoresist is then stripped.

In an alternative process step (not shown), the spacer 319 can be removed by ion implantation instead of by reactive ion etching with photoresist in place, as described above. The ion implantation may be angled such that it is directed at the sidewall of the lower gate portion 304. Preferably, the ion implantation occurs with argon ions, but any other suitable charged atom or molecule may be similarly utilized. The ion bombardment of the spacer 319 has the effect of substantially removing the spacer by a sputtering effect. Those spacers not directly exposed to the ion implantation, such as those spacers not orientated in a direction facing the ion beam, shadowed behind neighboring gate structures, remain intact. It should be noted that implementation of this method would require careful layout of the structures to properly predetermine which spacers are exposed to the angled ion implantation and which spacers are not exposed. Those gates conductors that are to be interconnected to a local diffusion region, for example, could be designed to run in a direction orthogonal to those gate conductors for which such interconnection is not intended.

Figure 4E:
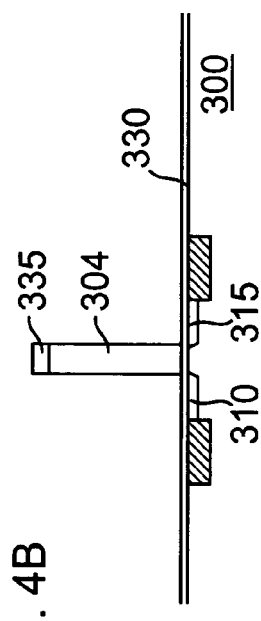
Figure 4F:
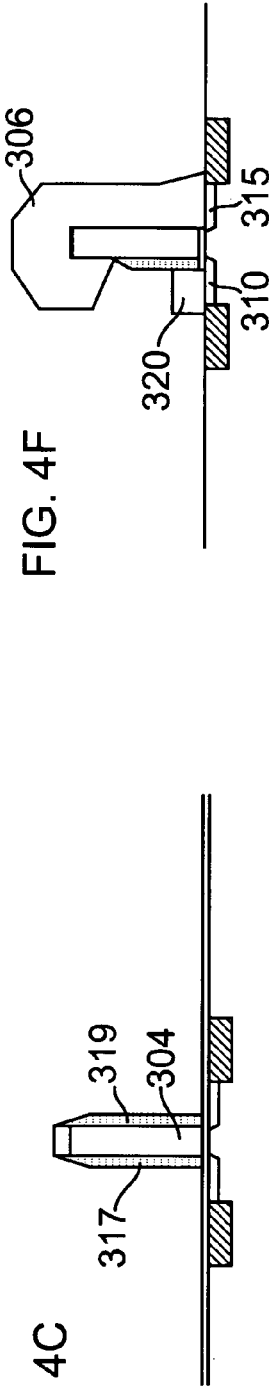

After spacer 319 is substantially removed, the structure is preferably exposed to a chemical vapor deposition process that deposits gate material on the source and drain regions 310, 315 and on exposed portions of the lower gate portion 304, but does not deposit gate material on any of the other exposed features, such as spacer 317 and the shallow trench features 324, 325, as shown in FIG. 4E. A deposition process capable of depositing material on one material but not on another material is commonly referred to as a "selective deposition." The result of this step is shown in FIG. 4F.

During the selective deposition process, raised source feature 320 is formed on the source region 310. Concurrently, deposition occurs on the top and sidewalls of the lower gate portion 304 and on the drain region 315. An enlarged upper gate region 306 is thereby formed on the lower gate portion 304 which electrically connects the gate structure with the drain region 315. In those regions where a drain-shorted gate device is not intended, the selective deposition has essentially no effect because the lower gate portion 304 is entirely encapsulated by the hard mask layer 335 and the spacers 317, 319, as previously explained. Moreover, the gate dielectric 330 inhibits any deposition on the source and drain regions 310, 315. These structures, therefore, continue to look like the structure shown in FIG. 4C.

If the lower gate portion 304 is formed of polysilicon, it is preferable to also form the upper gate portion 306 of polysilicon, although suitable alternative materials can be used. Chemical vapor deposition processes that substantially only deposit material on silicon and polysilicon will be familiar to those skilled in the art. This selectivity is based, at least in part, on differences in the initial interface reaction between the different materials and the vapor-phase reactants. Several good reactant source gases exist for the selective deposition of silicon and polysilicon. For example, dichlorosilane and silane may be used as reactants with the addition of hydrochloric acid. When compared with non-selective silicon deposition process, such as, for example, chemical vapor deposition, a selective deposition process is typically performed at a reduced pressure, an increased temperature, and a decreased mole fraction of the source reactants in the reactor gas stream. Selective chemical vapor deposition equipment is commercially available, such as, for instance, the "Applied Centura Epi" system, which is commercially available from Applied Materials (Santa Clara, Calif.).

Figure 2:
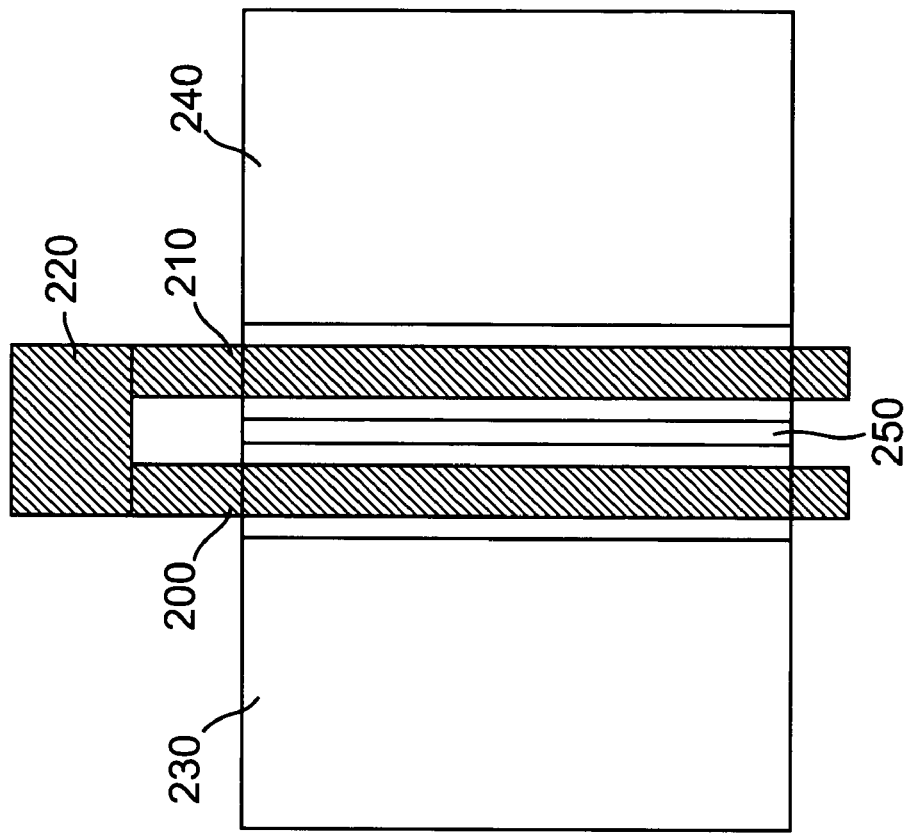
FIG. 2 is a top plan view of a semiconductor device illustrating a conventional methodology for connecting one gate conductor to another gate conductor.

Another type of device that utilizes an enlarged upper gate portion to form an electrical connection will now be considered. As described above, two or more gate conductors are frequently connected in series with common source and drain regions. Typically, these devices use a gate-level interconnect feature similar to feature 220 shown in FIG. 2. Such devices, which will be referred to herein as "interconnected gate devices," may suffer from poor space utilization since the gate-level interconnect feature must be formed outside of the active diffusion regions, as previously explained.

Figure 5C:
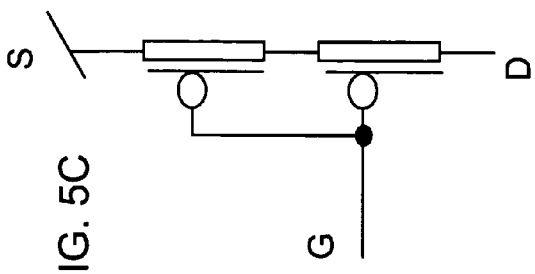
FIG. 5C is a schematic diagram depicting the exemplary device shown in FIGS. 5A and 5B.
Figure 5A:
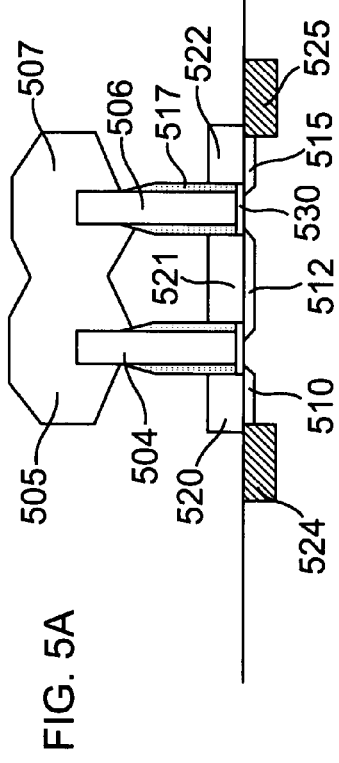
FIG. 5A is a cross-sectional view of an exemplary interconnected gate device formed in accordance with an illustrative embodiment of the invention.
Figure 5B:
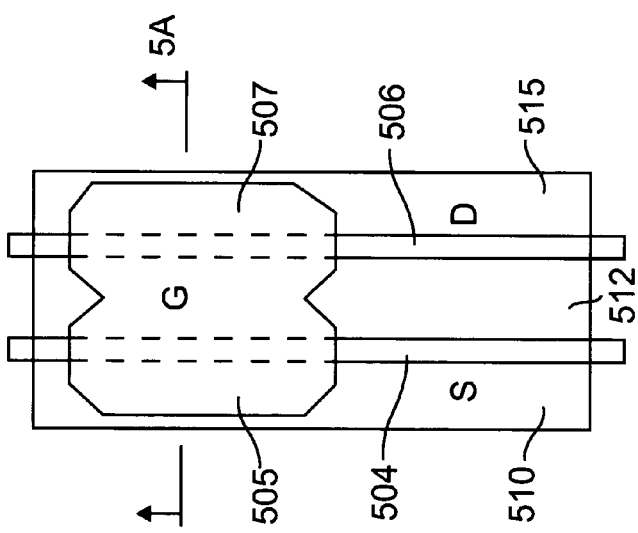
FIG. 5B is a top plan view of the exemplary device shown in FIG. 5A.

FIG. 5A shows a cross-sectional view of at least a portion of an integrated circuit including exemplary interconnected gate devices, formed in accordance with an illustrative embodiment of the invention. A corresponding top plan view and schematic diagram are shown in FIGS. 5B and 5C, respectively. In the interconnected gate devices shown in FIGS. 5A and 5B, each gate conductor comprises two portions, namely, a lower gate portion 504, 506, and an upper gate portion 505, 507. The upper gate portions 505, 507 are substantially wider than the corresponding lower gate portions 504, 506 and, in accordance with an aspect of the present invention, the devices are spaced relative to one another such that the upper gate portions 505, 507 merge with one another causing the gate conductors to be electrically interconnected.

Source region 510 and drain region 515 are formed in a substrate 500 of the integrated circuit. A shared diffusion region 512 is formed between the merged gate conductors. Raised source feature 520 and raised drain feature 522 are formed at least partially on top of the source and drain regions 510, 515, respectively, and are electrically connected thereto. Raised diffusion feature 521 is formed at least partially on top of, and in electrical contact with, the shared diffusion region 512. Spacers 517, formed substantially on sidewalls of the lower gate portions 504, 506, serve at least in part to electrically isolate the lower gate portions from the raised source and drain features 520, 522 and from the raised diffusion feature 521. Shallow trench features 524 and 525 formed in the substrate 500 are preferably filled with an insulating material (e.g., silicon dioxide) and serve to electrically isolate active regions of one device from another device.

FIG. 5B shows voltage/signal designations applied to the various regions in the device. From this view, it also becomes clear that the enlarged upper gate portions 505, 507 need not be formed along the entire lengths of the lower gate portions 504, 506, but may be formed in one or more regions along the lengths of the lower gate portions. Reference to the electrical schematic diagram in FIG. 5C indicates that the illustrative embodiment shown in FIGS. 5A and 5B forms two MOS transistors connected in series with one another. Shared diffusion region 512 serves to electrically connect channel regions of the two transistor devices together so that the voltage applied between source and drain regions 510, 515 acts across both devices.

Like the illustrative method for forming drain-shorted gate devices previously described in conjunction with FIGS. 4A–4F, FIGS. 6A–6C are cross-sectional views depicting exemplary process steps for forming the interconnected gate devices shown in FIGS. 5A–5C. These exemplary process steps use standard fabrication techniques that will be familiar to one skilled in the art. As previously stated, the process steps will not be described in detail for ease of explanation, but any omitted steps will be easily recognized by those skilled in the art.

Figure 6A:
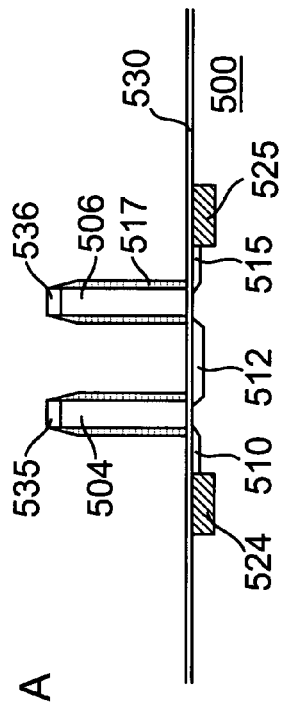
FIGS. 6A–6C are cross-sectional views depicting exemplary process steps for forming the device shown in FIG. 5A, in accordance with the present invention.

Forming the interconnected gate device is similar to forming the drain-shorted gate device. Referring now to FIG. 6A, the steps used to form lower gate portions 504, 506, source and drain regions 510, 515, hard mask layers 535, 536, gate dielectric 530, and spacers 517, are substantially identical to those described above for the drain-shorted gate and only require commonly known processing techniques. FIG. 6A shows the resulting structure after the above elements have been formed. A shared diffusion region 512 is preferably formed between the lower gate portions 504, 506 at the same time the source and drain regions 510, 515 are formed.

Figure 6B:
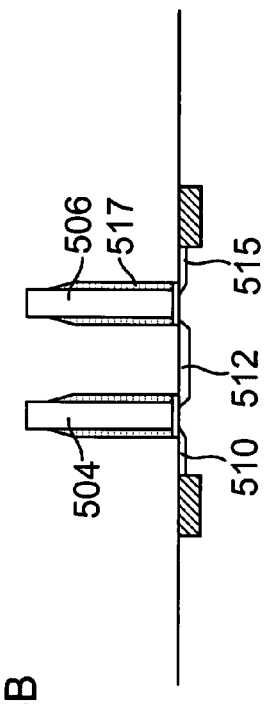

In subsequent processing steps, photolithography is used to cover regions of the integrated circuit where interconnected gate devices are not intended. Those gate regions where interconnected gate devices are intended are left exposed after developing the photoresist. With the photoresist in place, the structure is exposed to an etching process, such as, but not limited to, reactive ion etching, to remove the hard mask layers 535, 536 and the exposed gate dielectric 530. Etching also serves to recess the exposed spacers 517 further down the sidewalls of the lower gate portions 504, 506. The photoresist is then stripped from the remainder of the integrated circuit. Those gate regions that were covered during the etching process remain as shown in FIG. 6A, while those gate regions exposed by the etching process will appear as shown in FIG. 6B.

Figure 6C:
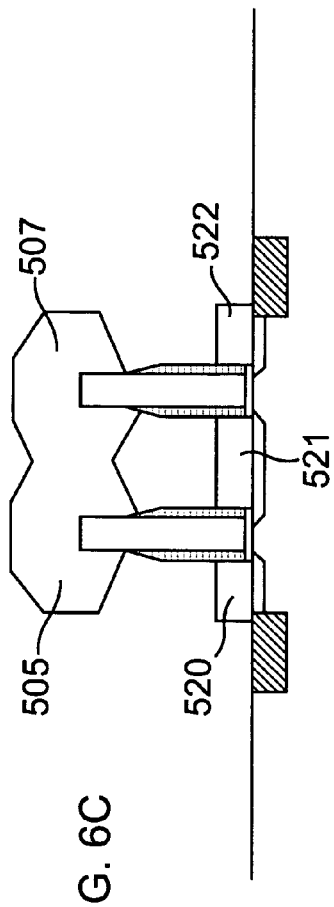

The structure is then exposed to a selective deposition process that deposits gate material on the source and drain regions 510, 515, the shared diffusion region 512, and the exposed regions of the lower gate portions 504, 506, resulting in the structure shown in FIG. 6C. The selective deposition process forms merged upper gate portions 505, 507, raised source and drain features 520, 522, and raised diffusion region 521. In those regions where the interconnected gate devices are not desired, the selective deposition has essentially no effect because the lower gate portions 504, 506 are entirely encapsulated by hard mask layers 535, 536 and the spacers 517, as shown in FIG. 6A. Moreover, the gate dielectric 530 inhibits substantially any deposition on the source and drain regions 510, 515.

It should be noted that in order to interconnect two transistors like those shown in FIG. 6A, the lower gate portions 504, 506 must be spaced such that their respective upper gate portions 505, 507 merge to such an extent as to provide a low resistance electrical connection therebetween. As the spacing between the interconnected gate devices increases, the amount of contact surface area between the two upper gate portions 505, 507 decreases accordingly, until some point at which the upper gate portions of the two devices are no longer merged.

Experimental results indicate that an upper gate portion with a width more than seven times that of the associated lower gate portion can be easily achieved using the selective chemical vapor deposition of polysilicon. Advantageously, by varying the distance between the lower gate portions of adjacent devices, the circuit designer can control where interconnected gate devices, such as that shown in FIG. 5A, will be formed and where they will not be formed. Where selective deposition occurs on the lower gate portions but the lower gate portions are spaced too far apart in relation to one another to allow their respective upper gate portions to merge, the integrated circuit will comprise discrete gate conductors with enlarged upper gate portions, resembling "mushroom-shaped" gate conductors.

The device of the present invention may be implemented in an integrated circuit. In forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A semiconductor device, comprising:
    a substrate of a first conductivity type;
    a source region of a second conductivity type formed in the substrate proximate an upper surface of the substrate;
    a drain region of the second conductivity type formed in the substrate proximate the upper surface of the substrate and spaced apart from the source region;
    a gate dielectric layer formed on at least a portion of the upper surface of the substrate;
    a raised source feature and a raised drain feature formed on the upper surface of the substrate, the raised source and drain features being electrically connected to the source and drain regions, respectively; and
    a gate structure formed on the gate dielectric layer at least partially between the source and drain regions, the gate structure including a lower gate portion formed on the gate dielectric layer and an enlarged upper gate portion supported above the gate dielectric layer by the lower gate portion, the upper gate portion being wider than the lower gate portion;
    wherein the upper gate portion of the gate structure is formed such that at least a portion of the upper gate portion merges with at least one of the raised source and drain features, thereby forming an electrical connection between the gate structure and at least one of the source and drain regions, respectively.

2. The device of claim 1, wherein:
    the lower gate portion comprises a sidewall; and
    the device further comprises a spacer formed on at least a portion of the sidewall, the spacer being configured to electrically isolate the lower gate portion from one of the source and drain regions.

3. A semiconductor device, comprising:
    a substrate of a first conductivity; and
    first and second transistor structures formed on the substrate, each of the first and second transistor structures including a gate dielectric layer formed on an upper surface of the substrate, a lower gate portion formed on the gate dielectric layer, and an enlarged upper gate portion supported above the gate dielectric layer by the lower gate portion, the upper gate portion being wider than the lower gate portion;
    wherein at least a portion of the upper gate portion of the first transistor structure merges with at least a portion of the upper gate portion of the second transistor structure such that the first transistor structure is electrically connected to the second transistor structure.

4. The device of claim 3, further comprising a shared diffusion region of a second conductivity type formed in the substrate, the shared diffusion region being disposed under at least a portion of the lower gate portions of the first and second transistors and at least partially between the lower gate portions.

5. The device of claim 3, further comprising:
    a shared diffusion region of a second conductivity type formed in the substrate, the shared diffusion region being disposed under at least a portion of each of the lower gate portions of the first and second transistors and at least partially between the lower gate portions; and
    a raised diffusion feature formed on the upper surface of the substrate and in electrical contact with the shared diffusion region.

6. The device of claim 3, wherein a cross-sectional width of the upper gate portions is about 1.5 to about five times a cross-sectional width of the lower gate portions.

7. A method for forming a semiconductor device, comprising the steps of:
    forming a substrate of a first conductivity type;
    forming a source region of a second conductivity type in the substrate proximate an upper surface of the substrate;
    forming a drain region of the second conductivity type in the substrate proximate the upper surface of the substrate and spaced apart from the source region;
    forming a gate dielectric layer on at least a portion of the upper surface of the substrate;
    forming a raised source feature and a raised drain feature on the upper surface of the substrate, the raised source and drain features being electrically connected to the source and drain regions, respectively; and
    forming a gate structure on the gate dielectric layer at least partially between the source and drain regions, the gate structure including a lower gate portion formed on the gate dielectric layer and an enlarged upper gate portion supported above the gate dielectric layer by the lower gate portion, the upper gate portion being wider than the lower gate portion;
    wherein the upper gate portion of the gate structure is formed such that at least a portion of the upper gate portion merges with at least one of the raised source and drain features, thereby forming an electrical connection between the gate structure and at least one of the source and drain regions, respectively.

8. The method of claim 7, wherein the gate structure comprises polysilicon.

9. The method of claim 7, wherein the step of forming the gate structure comprises depositing gate material substantially on at least one of silicon and polysilicon using selective chemical vapor deposition.

10. The method of claim 7, wherein:

the lower gate portion comprises first and second sidewalls; and the step of forming the device further comprises forming first and second spacers on the first and second sidewalls, respectively, and substantially removing the first spacer from the first sidewall.

11. The method of claim 10, wherein the step of substantially removing the first spacer from the first sidewall comprises a photolithography process.

12. The method of claim 10, wherein the step of substantially removing the first spacer from the first sidewall comprises ion implantation.

13. The method of claim 12, wherein an angle of the ion implantation is selected to be greater than about twenty degrees relative to a direction normal to the upper surface of the substrate.

14. A method for forming a semiconductor device, comprising the steps of:

forming a substrate of a first conductivity; and forming a first transistor structure and a second transistor structure on the substrate, each transistor structure including a gate dielectric layer formed on an upper surface of the substrate, a lower gate portion formed on the gate dielectric layer, and an enlarged upper gate portion supported above the gate dielectric layer by the lower gate portion, the upper gate portion being wider than the lower gate portion;

wherein at least a portion of the upper gate portion of the first transistor structure merges with at least a portion of the upper gate portion of the second transistor structure such that the first transistor structure is electrically connected to the second transistor structure.

15. The method of claim 14, wherein the step of forming the first and second transistor structures comprises forming polysilicon.

16. The method of claim 14, wherein the step of forming at least one of the first and second transistor structures comprises using a selective chemical vapor deposition process for forming material substantially only on silicon and polysilicon.

17. The method of claim 14, wherein:

the lower gate portions of the first and second transistor structures each comprise two sidewalls; and the step of forming the first and second transistor structures comprises forming spacers on the sidewalls and recessing at least a portion of the spacers.

18. The method of claim 14, wherein the step of forming the first and second transistor structures comprises:

forming hard mask layers on top of at least a portion of the lower gate portions of the first and second transistor structures; and etching the hard mask layers.

19. The method of claim 18, wherein the hard mask layers comprise a material selected from the group consisting of silicon dioxide, silicon nitride and silicon oxynitride.

* * * * *